(12) United States Patent
Tamma et al.

(10) Patent No.: US 11,942,571 B2
(45) Date of Patent: Mar. 26, 2024

(54) LED WITH ACTIVE REGION DISPOSED WITHIN AN OPTICAL CAVITY DEFINED BY AN EMBEDDED NANOSTRUCTURED LAYER AND A REFLECTOR

(71) Applicant: LUMILEDS LLC, San Jose, CA (US)

(72) Inventors: Venkata Ananth Tamma, San Jose, CA (US); Toni Lopez, Aachen (DE)

(73) Assignee: Lumileds LLC, San Jose, CA (US)

( * ) Notice: Subject to any disclaimer, the term of this patent is extended or adjusted under 35 U.S.C. 154(b) by 165 days.

(21) Appl. No.: 16/854,767

(22) Filed: Apr. 21, 2020

(65) Prior Publication Data

US 2020/0335661 A1 Oct. 22, 2020

Related U.S. Application Data

(60) Provisional application No. 62/837,099, filed on Apr. 22, 2019.

(51) Int. Cl.
| | |
|---|---|
| *H01L 33/10* | (2010.01) |
| *H01L 27/15* | (2006.01) |
| *H01L 33/32* | (2010.01) |
| *H01L 33/38* | (2010.01) |

(52) U.S. Cl.
CPC ............ *H01L 33/10* (2013.01); *H01L 27/156* (2013.01); *H01L 33/32* (2013.01); *H01L 33/382* (2013.01)

(58) Field of Classification Search
CPC ....... H01L 33/10; H01L 27/156; H01L 33/32; H01L 33/382; H01L 33/385; H01L 2933/0083; H01L 33/58; H01L 33/46
See application file for complete search history.

(56) References Cited

U.S. PATENT DOCUMENTS

| | | |
|---|---|---|
| 8,288,755 B2 | 10/2012 | Kim |
| 9,647,173 B2 | 5/2017 | Kim et al. |
| 10,985,143 B2 | 4/2021 | Bower et al. |
| (Continued) | | |

FOREIGN PATENT DOCUMENTS

| | | |
|---|---|---|
| JP | 2010067984 A | 3/2010 |
| JP | 2014017520 A | 1/2014 |
| (Continued) | | |

OTHER PUBLICATIONS

From the EPO as the ISA, Notification of Transmittal of the International Search Report and the Written Opinion of the International Searching Authority corresponding to PCT/US2020/029253, dated Jul. 29, 2020, 11 pages.

*Primary Examiner* — Su C Kim

(57) ABSTRACT

This specification discloses LEDs in which the light emitting active region of the semiconductor diode structure is located within an optical cavity defined by a nanostructured layer embedded within the semiconductor diode structure on one side of the active region and a reflector located on the opposite side of the active region from the embedded nanostructured layer. The reflector may, for example, be a conventional specular reflector disposed on or adjacent to a surface of the semiconductor diode structure. Alternatively, the reflector may or comprise a nanostructured layer. The reflector may comprise a nanostructured layer and a specular reflector, with the nanostructured layer disposed adjacent to the specular reflector between the specular reflector and the active region.

31 Claims, 8 Drawing Sheets

(56) References Cited

U.S. PATENT DOCUMENTS

| | | | |
|---|---|---|---|
| 11,393,963 B2 | 7/2022 | Iguchi et al. | |
| 2011/0062414 A1* | 3/2011 | Wang | H01L 33/02 257/13 |
| 2011/0316026 A1* | 12/2011 | Kim | H01L 33/025 257/E33.072 |
| 2012/0050694 A1 | 3/2012 | Huang et al. | |
| 2014/0167066 A1* | 6/2014 | Kashima | H01L 33/20 257/98 |
| 2019/0113727 A1 | 4/2019 | Tamma | |
| 2019/0115492 A1 | 4/2019 | Tamma et al. | |

FOREIGN PATENT DOCUMENTS

| | | |
|---|---|---|
| KR | 20090111810 A | 10/2009 |
| KR | 10-2017-0020485 A | 2/2017 |
| WO | 2008/079076 A1 | 7/2008 |
| WO | 2019/053923 A1 | 3/2019 |

* cited by examiner

LED WITH ACTIVE REGION DISPOSED WITHIN AN OPTICAL CAVITY DEFINED BY AN EMBEDDED NANOSTRUCTURED LAYER AND A REFLECTOR

CROSS REFERENCE TO RELATED APPLICATIONS

This application claims benefit of priority to U.S. Provisional Patent Application No. 62/837,099 filed Apr. 22, 2019 which is incorporated herein by reference in its entirety.

FIELD OF THE INVENTION

The invention relates generally to light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

Conventional LEDs typically comprise an active light-emitting layer in a high refractive index semiconductor diode structure placed above a reflector, and a light exit surface located opposite from that reflector.

LEDs may be combined with one or more wavelength converting materials (generally referred to herein as "phosphors") that absorb light emitted by the LED and in response emit light of a longer wavelength. Such devices may be referred to as phosphor-converted LEDs ("pcLEDs").

SUMMARY

This specification discloses LEDs in which the light emitting active region of the semiconductor diode structure is located within an optical cavity defined by a nanostructured layer embedded within the semiconductor diode structure on one side of the active region and a reflector located on the opposite side of the active region from the embedded nanostructured layer.

The reflector may, for example, be a conventional specular reflector disposed on or adjacent to a surface of the semiconductor diode structure. Alternatively, the reflector may be or comprise a nanostructured layer. The reflector may comprise a nanostructured layer and a specular reflector, with the nanostructured layer disposed adjacent to the specular reflector between the specular reflector and the active region.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
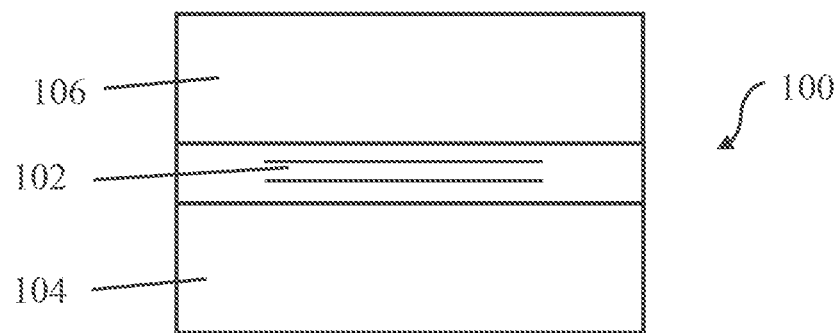
FIG. 1 shows a schematic cross-sectional view of an example pcLED.

FIG. 1 shows an example of an individual pcLED 100 comprising a semiconductor diode structure 102 (an LED) disposed on a substrate 104, and a phosphor layer or structure 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
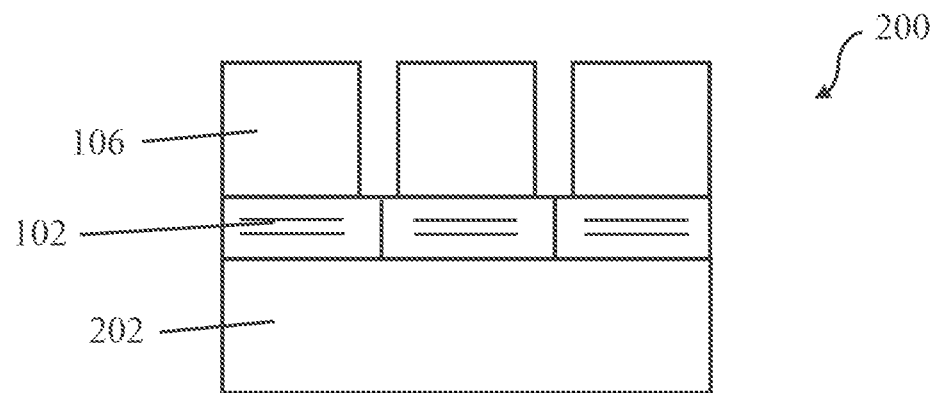
FIGS. 2A and 2B show, respectively, cross-sectional and top schematic views of an array of pcLEDs.
Figure 2B:
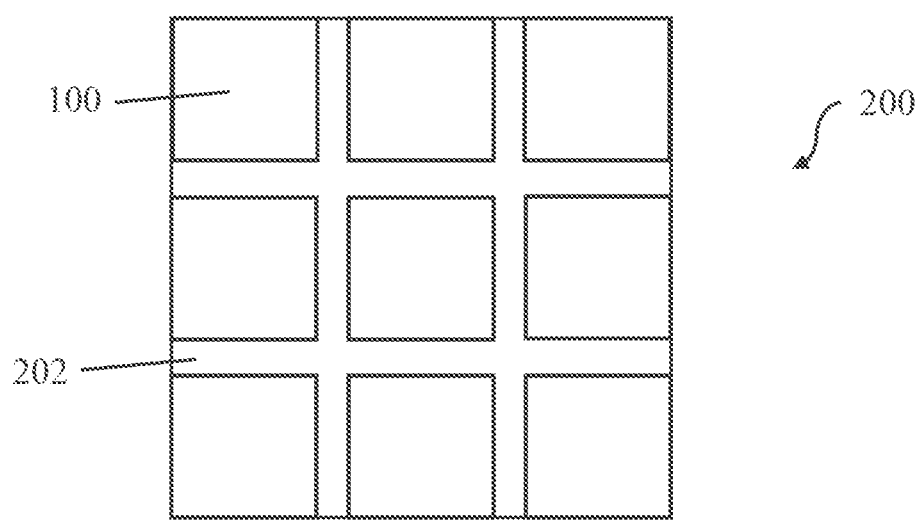

FIGS. 2A-2B show, respectively, cross-sectional and top views of an array 200 of pcLEDs 100 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable material.

Figure 3A:
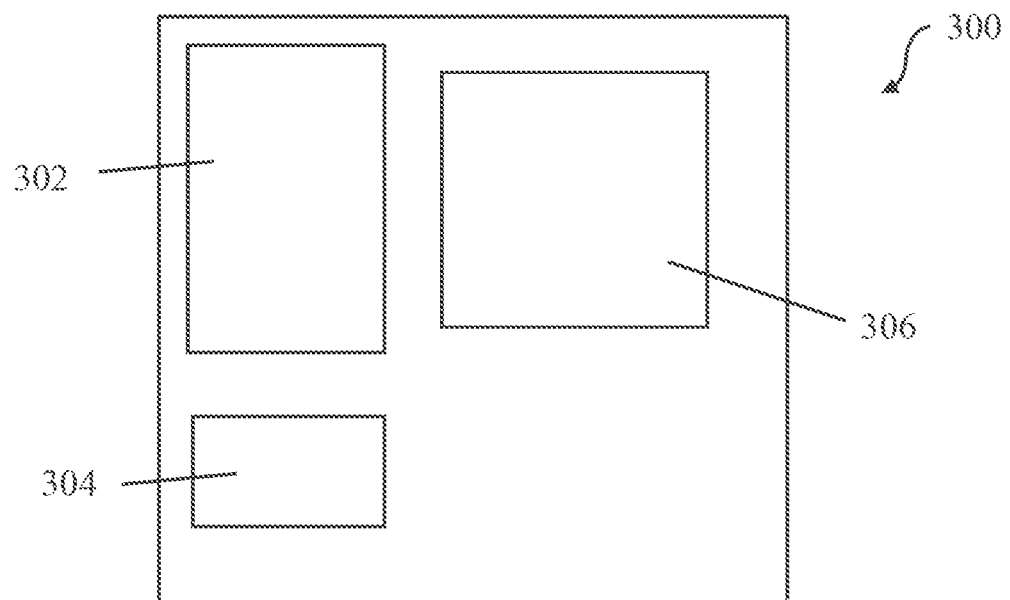
FIG. 3A shows a schematic top view of an electronics board on which an array of pcLEDs may be mounted, and FIG. 3B similarly shows an array of pcLEDs mounted on the electronic board of FIG. 3A.
Figure 3B:
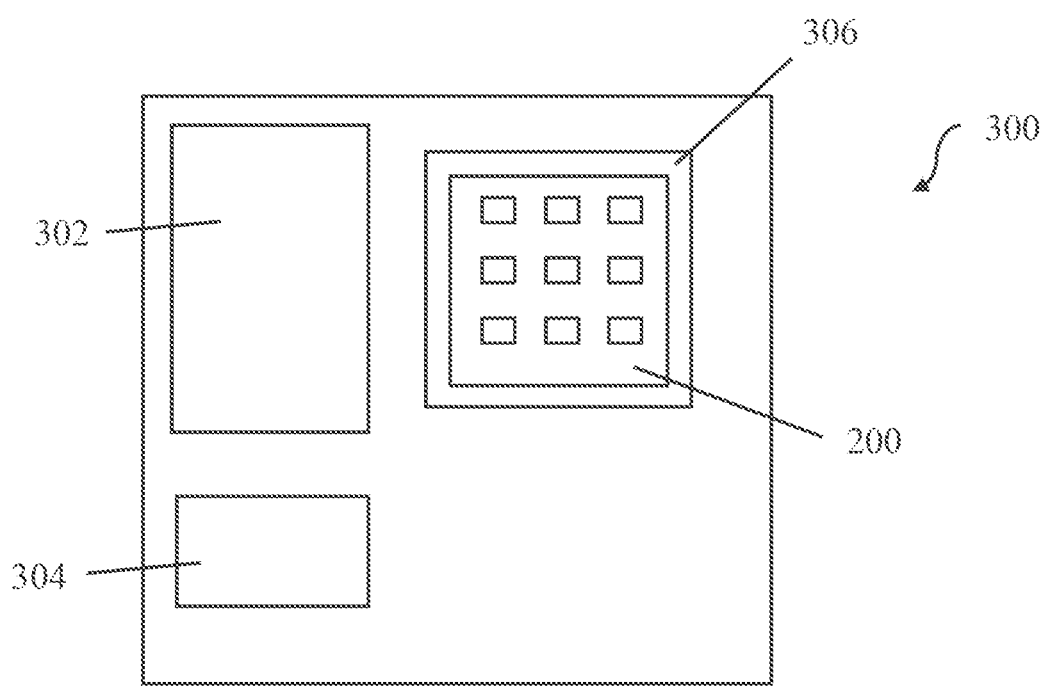

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
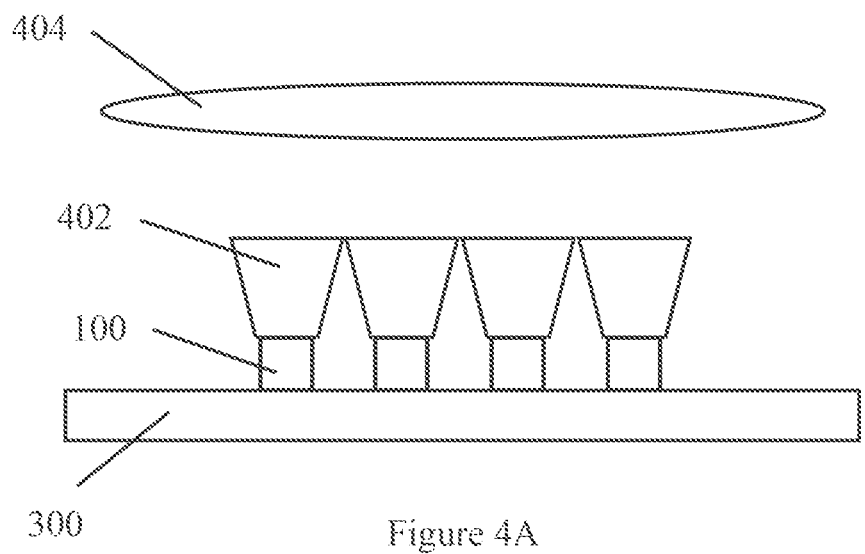
FIG. 4A shows a schematic cross sectional view of an array of pcLEDs arranged with respect to waveguides and a projection lens.
Figure 4B:
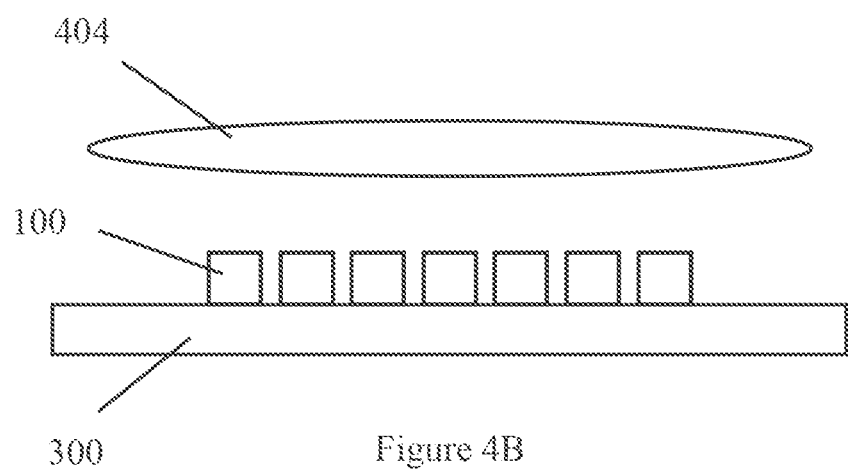
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

Referring again to FIGS. 2A-2B, although these figures show a three by three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape.

Figure 2C:
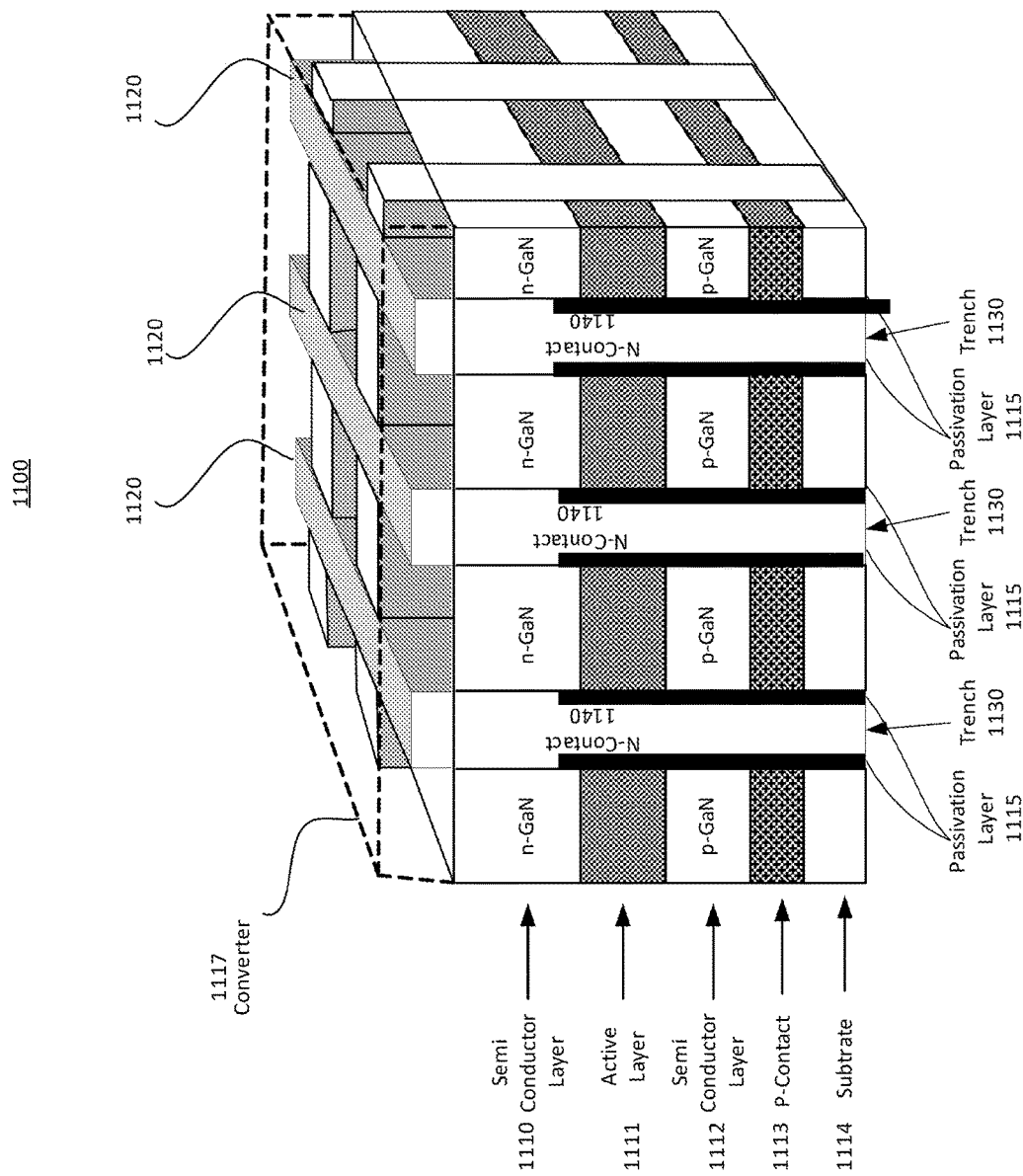
FIG. 2C shows a perspective view of a monolithic array of pcLEDs.

LEDs having dimensions in the plane of the array (e.g., side lengths) of less than or equal to about 50 microns are typically referred to as microLEDs, and an array of such microLEDs may be referred to as a microLED array An array of LEDs, or portions of such an array, may be formed as a segmented monolithic structure in which individual LED pixels are electrically isolated from each other by trenches and or insulating material. FIG. 2C shows a perspective view of an example of such a segmented monolithic array 1100. Pixels in this array are separated by trenches 1130 which are filled to form n-contacts 1140. The monolithic structure is grown or disposed on a substrate 1114. Each pixel includes a p-contact 1113, a p-GaN semiconductor layer 1112, an active region 1111, and an n-GaN semiconductor layer 1110. A wavelength converter material 1117 may be deposited on the semiconductor layer 1110 (or other applicable layer). Passivation layers 1115 may be formed within the trenches 1130 to separate at least a portion of the n-contacts 1140 from one or more layers of the semiconductor. The n-contacts 1140, or other material within the trenches, may extend into the converter material 1117 such that the n-contacts 1140 or other material provide complete or partial optical isolation 1120 between the pixels.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Light emitting pixel arrays have a wide range of applications. Light emitting pixel array luminaires can include light fixtures which can be programmed to project different lighting patterns based on selective pixel activation and intensity control. Such luminaires can deliver multiple controllable beam patterns from a single lighting device using no moving parts. Typically, this is done by adjusting the brightness of individual LEDs in a 1D or 2D array. Optics, whether shared or individual, can optionally direct the light onto specific target areas.

Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Vehicle headlamps are a light emitting array application that requires large pixel numbers and a high data refresh rate. Automotive headlights that actively illuminate only selected sections of a roadway can be used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Typically, the above applications for LEDs, arrays of LEDs, pcLEDs, and arrays of pcLEDs benefit from improved efficiency of light generation in and light extraction from the LED. These applications typically also benefit from greater control of the direction in which light is radiated from the active region, and of the direction from which light is extracted from the LED. These benefits typically accrue whether or not the device comprises a wavelength converting structure.

As summarized above, this specification discloses LEDs in which the light emitting active region of the semiconductor diode structure is located within an optical cavity defined by a nanostructured layer embedded within the semiconductor diode structure on one side of the active region and a reflector located on the opposite side of the active region from the embedded nanostructured layer. The active region may comprise multiple quantum wells, for example.

The embedded nanostructured layer may comprise an arrangement of nanoantennas. A nanoantenna comprises one or more light scatterers. Individual ones of the nanoantennas may have subwavelength dimensions, that is, dimensions that are less than or equal to the peak wavelength of light emitted by the active region. The nanoantennas may have subwavelength dimensions in all directions. Alternatively, the nanoantennas may have subwavelength dimensions in a plane of the nanostructured layer, and larger dimensions perpendicular to that plane. The arrangement of nanoantennas may be periodic or aperiodic, and any suitable spacing between nanoantennas may be used. The nanoantennas may have any suitable shape, may by symmetric or asymmetric as suitable, and may be formed from light scatterers of any suitable shape, for example from cylindrical, cubic, or pyramidal light scatterers. The embedded nanostructured layer may include one or more layers of nanoantennas.

The nanoantennas in the embedded nanostructured layer may preferably be formed from one or more dielectric materials, but metals, conductors, or mixtures of dielectric materials, metals, and conductors may be used if suitable.

The reflector may be a specular reflector, such as for example a metal surface or a distributed Bragg reflector.

The reflector may alternatively be or comprise a nanostructured reflector layer comprising an arrangement of nanoantennas. These nanoantennas may be formed from dielectric materials, metals, semiconductors, or a mixture thereof. Individual ones of the nanoantennas may have subwavelength dimensions. The nanoantennas may have subwavelength dimensions in all directions. Alternatively, the nanoantennas may have subwavelength dimensions in a plane of the nanostructured reflector layer, and larger dimensions perpendicular to that plane. The arrangement of nanoantennas may be periodic or aperiodic, and any suitable spacing between nanoantennas may be used. The nanoantennas may have any suitable shape, may by symmetric or asymmetric as suitable, and may be formed from light scatterers of any suitable shape, for example from cylindrical, cubic, or pyramidal light scatterers. The nanostructured reflector layer may include one or more layers of nanoantennas. The nanoantennas of the nanostructured reflector layer may be embedded in an embedding medium, for example a dielectric medium. Alternatively these nanoantennas may be embedded in the semiconductor diode structure.

The reflector may comprise a specular reflector and a nanostructured reflector layer, with the nanostructured reflector layer located between the specular reflector and the active region. In such cases the nanoantennas may be spaced apart from the specular reflector and or from the semiconductor diode structure by a spacer layer, which may be a dielectric material for example. In a reflector comprising a specular reflector and a nanostructured layer, the nanostructured layer may, for example, be located at or within a distance from the specular reflector corresponding to a single wavelength at the peak emission wavelength from the active region. A non-specularly reflective surface, for example a light scattering surface, may be substituted for the specular reflector in some variations.

The reflector, whether comprising a nanostructured layer or not, may for example be located at or within a distance from the active layer corresponding to a single wavelength at the peak emission wavelength from the active region. The embedded nanostructured layer may be located at or within a distance from the active layer corresponding to a single wavelength at the peak emission wavelength from the active region, at a location multiple wavelengths from the active region intermediate between the active region and a light exit surface from the semiconductor diode structure, or adjacent the light exit surface of the light emitting semiconductor diode structure at a distance of multiple wavelengths from the active region.

The reflector or a portion of the reflector may be or form part of an electric contact to the semiconductor diode structure.

The active region may be centered or approximately centered between the embedded nanostructured layer and the reflector, closer to the reflector than to the embedded nanostructured layer, or closer to the embedded nanostructured layer than to the reflector.

This LED architecture, with the active region (e.g., comprising quantum wells) located in an optical cavity defined by a reflector and a nanostructured layer embedded in the semiconductor diode structure, can be arranged so that the active region preferentially emits light in a forward direction toward the embedded nanostructured layer, which can improve the efficiency with which light is extracted from the LED. This architecture can also increase the radiative rate from the active region, which improves the internal quantum efficiency of the LED. Further advantages include reducing or eliminating a need for bulky optics such as silicone domes, for example, reducing source size, and increasing emitter brightness.

The improved directionality and internal quantum efficiency resulting from this architecture can be understood theoretically in terms of an optical cavity analysis in which the nanostructured layer and the reflector define cavity modes and a density of states that can be tuned by a designer, using simulation and analytical analysis, by varying the structures and positions of the nanostructured layer and the reflector to achieve these results. Alternatively these results can be understood in terms of oscillating dipoles in the active region and light emitted by the active region interacting with the nanostructured layer, with the reflector, and with light reradiated by the nanostructured layer and the reflector. In this approach also, a designer using simulations and analytical analysis can tune the interactions between the active region, the reflector, and the embedded nanostructure layer by varying their structures and positions to achieve the desired results.

FIGS. 5A-5D, 6A-6B, and 7A-7B schematically show example LEDs comprising an active region disposed between an embedded nanostructured layer and a reflector, as described above. Although these figures show individual LEDs, the cavity structure described above and the examples shown in these figures may be employed in LEDs arranged in LED arrays, for example in microLEDs and in monolithic microLED arrays. Further, though the example LED devices shown in FIGS. 5A-5D, 6A-6B, and 7A-7B do not include phosphor layers (wavelength conversion structures), the cavity structure described above and the examples shown in these figures may be employed in combination with wavelength conversion structures to provide pcLEDs and arrays of pcLEDs.

In the specific examples described below the semiconductor diode structures are described as III-N semiconductor diode structures, referred to by shorthand as GaN semiconductor diode structures, but more generally the semiconductor diode structure may be formed from any suitable material system, including those listed earlier in this description. These figures are simplified and omit, for example, details of electrical contacts to the p and n sides of the semiconductor diode structure.

Figure 5A:
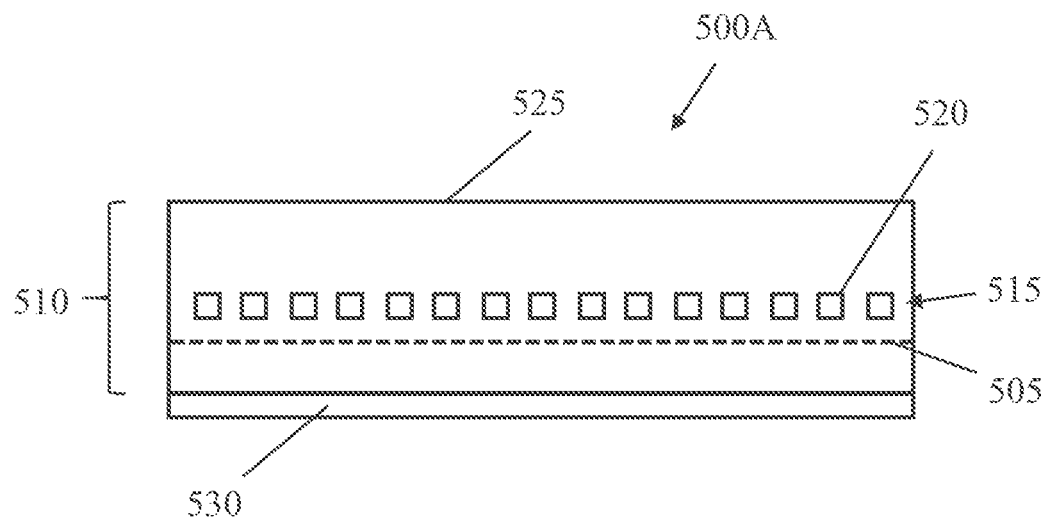
FIG. 5A shows a schematic cross-sectional view of an example LED in which the light emitting active region of the semiconductor diode structure is located within an optical cavity defined by a nanostructured layer embedded within the semiconductor diode structure on one side of the active region and a reflector disposed on or adjacent to a surface of the semiconductor diode structure on the opposite side of the active region from the embedded nanostructured layer.

Referring now to FIG. 5A, an example LED 500A comprises an active region 505 disposed in a GaN semiconductor diode structure 510. Active region 505 may comprise multiple quantum wells. A nanostructured layer 515 comprising nanoantennas 520 is disposed in the semiconductor diode structure 510 between the active region 505 and a light exit surface 525 of the semiconductor diode structure. A conventional specular reflector 530 is disposed on or adjacent to a surface of the semiconductor diode structure 510, opposite from the light exit surface 525 and on the opposite side of the active region 505 from the nanostructured layer 515. The nanostructured layer 515 and the specular reflector 530 define an optical cavity as described above, and may have any of the structures and any of the arrangements with respect to each other and active region 505 described above.

Figure 5B:
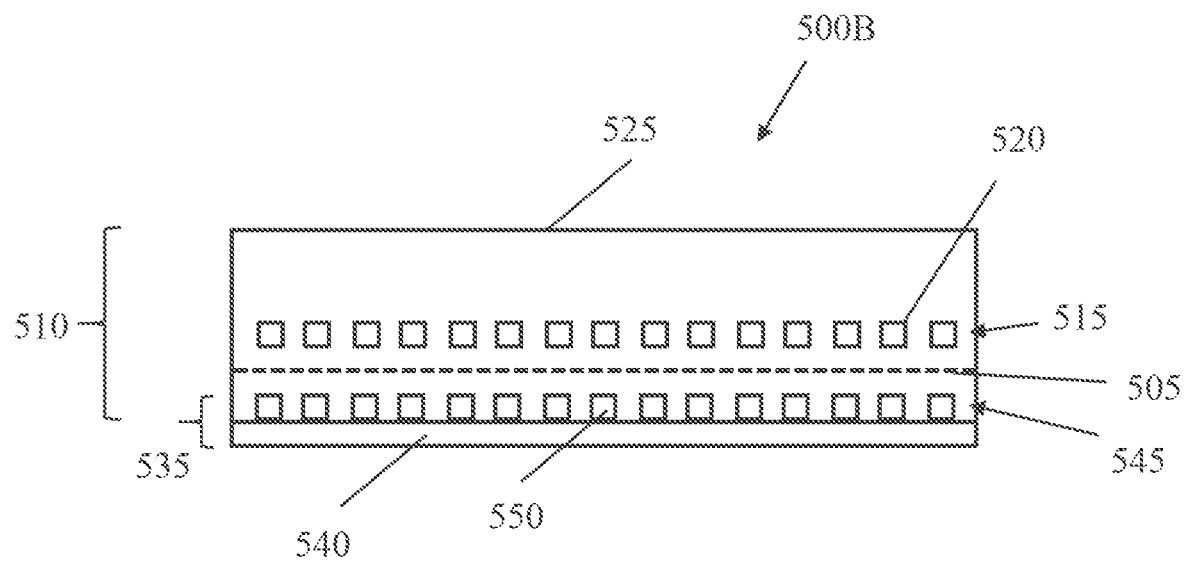
FIG. 5B, FIG. 5C, and FIG. 5D show cross-sectional views of variations of the example LED of FIG. 5A in which the reflector is or comprises another nanostructured layer.

Example LED 500B shown in FIG. 5B is similar to example LED 500A of FIG. 5A, except that specular reflector 530 is replaced by a reflector 535 that comprises a specular reflector 540 and a nanostructured layer 545 comprising nanoantennas 550 positioned adjacent to specular reflector 540 and disposed between specular reflector 540 and active region 505. In this example, nanoantennas 550 are embedded into a surface of the semiconductor diode structure 510. The nanostructured layer 515 and reflector 535 define an optical cavity as described above, and may have any of the structures and any of the arrangements with respect to each other and active region 505 described above.

Figure 5C:
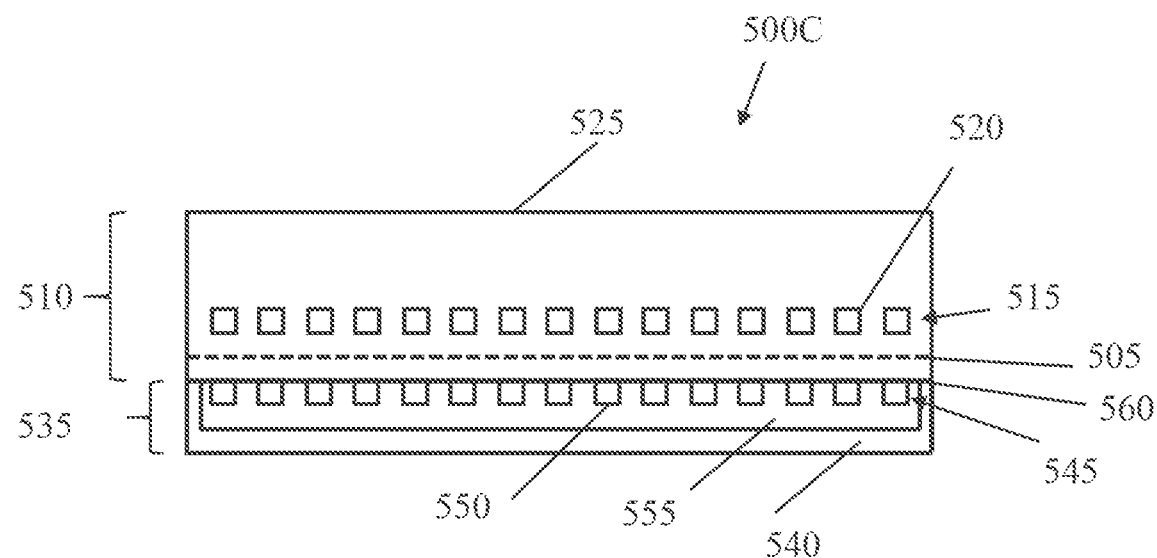

Example LED 500C shown in FIG. 5C is similar to example LED 500B, except that in reflector 535 nanoantennas 550 are disposed on or adjacent to a surface of semiconductor diode structure 510, embedded in a dielectric medium 555, and spaced apart from specular reflector 540. A layer 560 of conductive metal oxide (for example, ITO) may be disposed between the embedding medium 555 and the semiconductor diode structure 510 to facilitate electrical contact to the semiconductor diode structure.

Figure 5D:
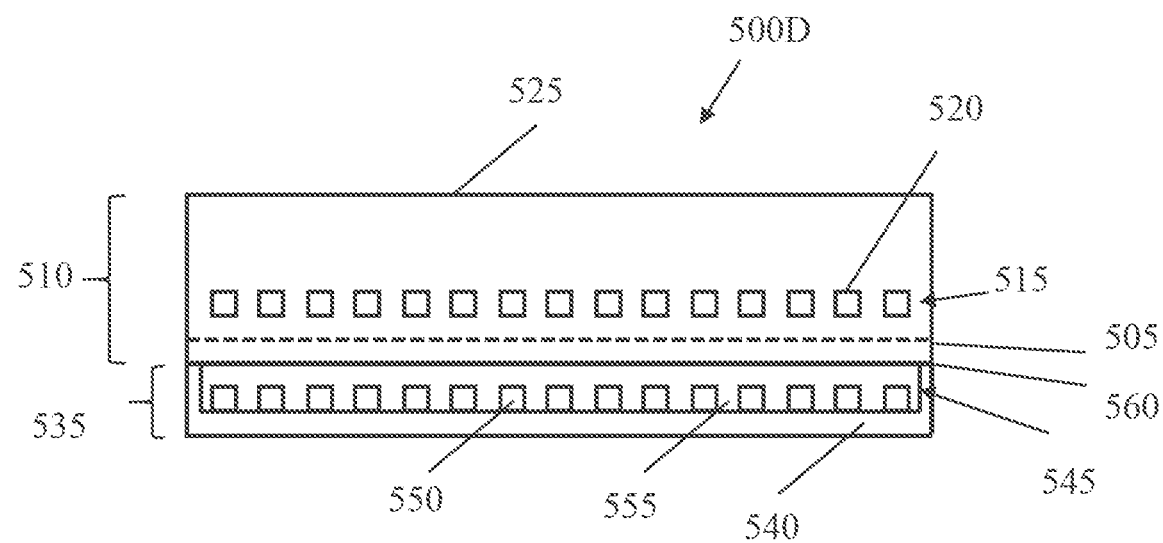

Example LED 500D shown in FIG. 5D is similar to example LED 500C, except that nanoantennas 550 are disposed on or adjacent to specular reflector 540 and spaced apart from the surface of the semiconductor diode structure.

In some variations of example LEDs 500B, 500C, and 500D, an LED has an otherwise similar structure but lacks specular reflector 540.

In other variations of example LEDs 500B, 500C, and 500D, structure 540 is a reflector but is not a specular reflector, for example, it may scatter incident light rather than specularly reflect it.

Other reflector structures that may be suitable for reflector 535 include those disclosed in U.S. Patent Publication 2019/0115492, which is incorporated herein by reference in its entirety.

The example LEDs shown schematically in FIGS. 6A, 6B, 7A, and 7B are based on example LED 500B of FIG. 5B. Similar LED structures may be based instead on the example LEDs shown in FIGS. 5A, 5C, and 5D.

Figure 6A:
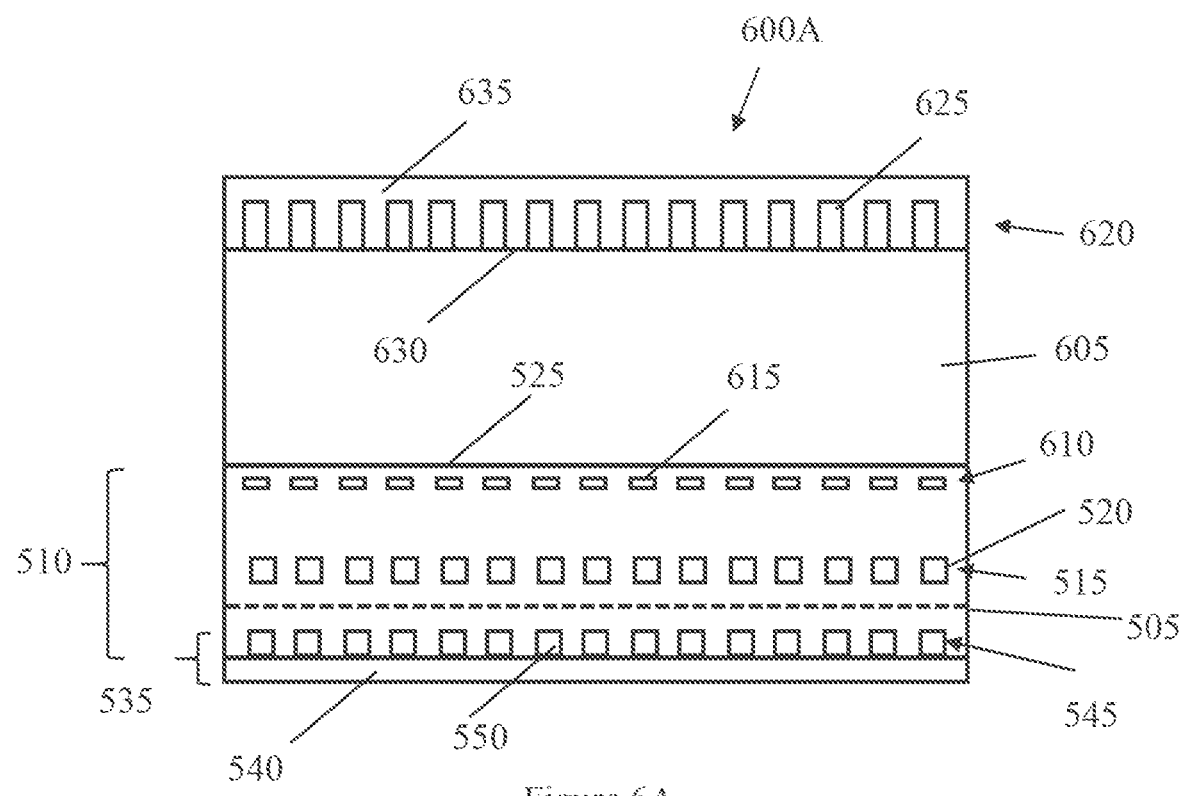
FIG. 6A shows a schematic cross-sectional view of another example LED in which the light emitting active region of the semiconductor diode structure is located within an optical cavity defined by a nanostructured layer embedded within the semiconductor diode structure on one side of the active region and a reflector disposed on or adjacent to a surface of the semiconductor diode structure on the opposite side of the active region from the embedded nanostructured layer, and in which the reflector is or comprises another nanostructured layer.

Example LED 600A shown in FIG. 6A comprises a substrate 605 disposed on or adjacent to light exit surface 525 of semiconductor diode structure 510. Substrate 605 is transparent to light emitted by active region 515, and may for example be a sapphire substrate.

LED 600A may optionally comprise a nanostructured layer 610 of nanoantennas 615 disposed at or near the interface of transparent substrate 605 and semiconductor diode structure 510. Nanoantennas 615 may be partially or entirely embedded in the semiconductor diode structure, as illustrated. Alternatively, they may be disposed on light exit surface 525 between semiconductor diode structure 510 and substrate 605, optionally embedded in another medium Nanoantennas 615 may be formed from dielectric materials, metals, semiconductors, or a mixture thereof. If embedded in semiconductor diode structure 510, nanoantennas 615 may preferably be formed from dielectric materials. Individual ones of the nanoantennas may have subwavelength dimensions. The nanoantennas may have subwavelength dimensions in all directions. Alternatively, the nanoantennas may have subwavelength dimensions in a plane of the nanostructured layer 610, and larger dimensions perpendicular to that plane. The arrangement of nanoantennas may be periodic or aperiodic, and any suitable spacing between nanoantennas may be used. The nanoantennas may have any suitable shape, may by symmetric or asymmetric as suitable, and may be formed from light scatterers of any suitable shape, for example from cylindrical, cubic, or pyramidal light scatterers. The nanostructured layer 610 may include one or more layers of nanoantennas.

Nanostructured layer 610 may be designed to improve extraction of light from semiconductor diode structure 510 into substrate 605, for example by reducing total internal reflection at that interface, and may in addition or alternatively be designed to shape the angular distribution of light extracted through that interface.

Example LEDs 500A, 500B, and 500C may optionally and similarly include a nanostructured layer 610 of nanoantennas 615 disposed on or near semiconductor diode structure light exit surface 525 to improve extraction of light from semiconductor diode structure 510 into ambient air or another medium, for example, and to in addition or alternatively shape the angular distribution of light extracted through light exit surface 525.

Referring again to FIG. 6A, example LED 600A may optionally include a nanostructured layer 620 of nanoantennas 625 disposed on or adjacent to a surface 630 of substrate 605, opposite from semiconductor diode structure 510.

Nanoantennas 625 may be formed from dielectric materials, metals, semiconductors, or a mixture thereof. Individual ones of the nanoantennas may have subwavelength dimensions. The nanoantennas may have subwavelength dimensions in all directions. Alternatively, the nanoantennas may have subwavelength dimensions in a plane of the nanostructured layer 620, and larger dimensions perpendicular to that plane. The arrangement of nanoantennas may be periodic or aperiodic, and any suitable spacing between nanoantennas may be used. The nanoantennas may have any suitable shape, may by symmetric or asymmetric as suitable, and may be formed from light scatterers of any suitable shape, for example from cylindrical, cubic, or pyramidal light scatterers. The nanostructured layer 620 may include one or more layers of nanoantennas. Nanoantennas 625 may be embedded in an embedding medium 635, for example a dielectric material, as illustrated.

Nanostructured layer 620 may be designed to be a collimating structure that images the active region or any other region within the LED to the far field to produce collimated emission from the LED. Alternatively, nanostructured layer 620 may be designed to transmit or scatter light out of substrate 605 only if the light is incident on nanostructured layer 620 within a desired angular range, and to reflect back into the LED light incident outside of that angular range, thereby functioning as an angular filter that reduces the cone angle of the light emitted through surface 630 of substrate 605.

Nanostructured layer configurations that may be suitable for use as a collimating nanostructured layer 620 are disclosed in U.S. Patent Publication 20190113727, which is incorporated herein by reference in its entirety. Nanostructured layer configurations that may be suitable for use as an angular filter nanostructured layer 620 are disclosed in U.S. patent application Ser. No. 16/230,760 filed Dec. 21, 2018, which is incorporated herein by reference in its entirety.

Figure 6B:
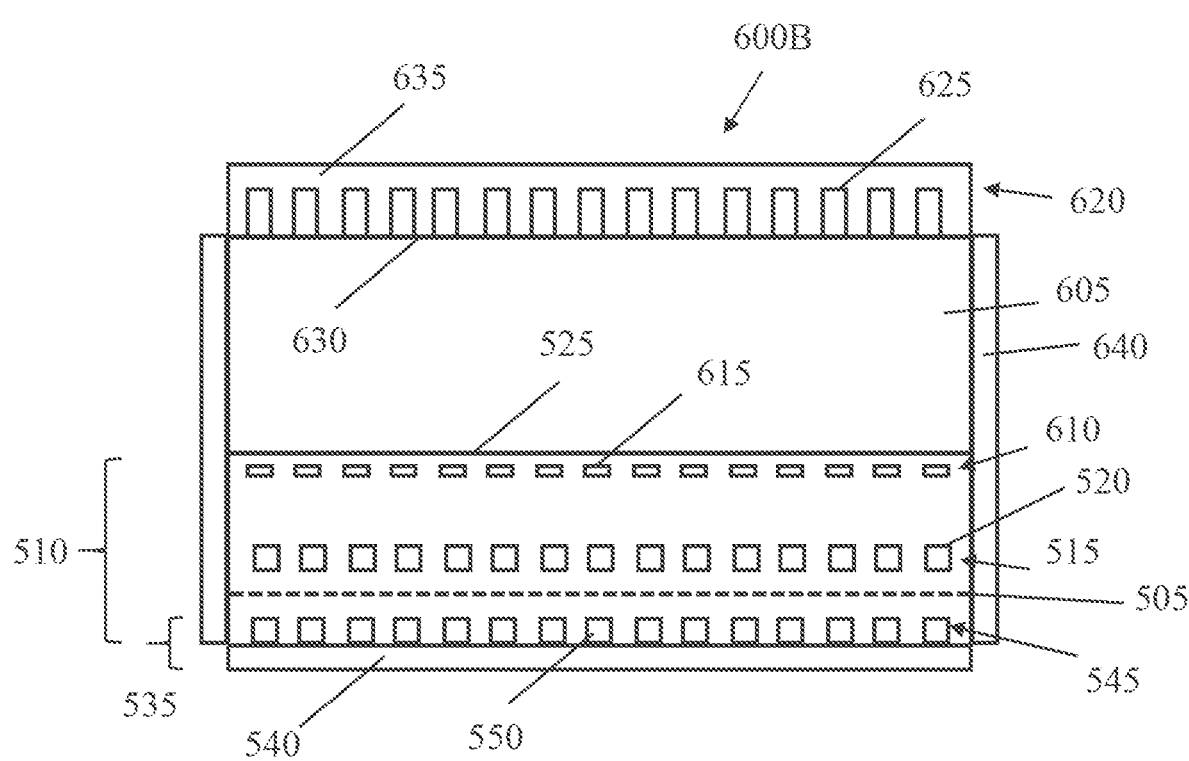
FIG. 6B shows a schematic cross-sectional view of a variation of the LED of FIG. 6A comprising side reflectors.

Example LED 600B shown in FIG. 6B is similar to Example LED 600A, except that it includes side reflectors 640 disposed on sidewalls of semiconductor diode structure 510 and substrate 605. Side reflectors 640 may be distributed Bragg reflectors, for example. Similar side reflectors may be disposed on side walls of the semiconductor diode structure 510 of Example LEDs 500A-500D.

Figure 7A:
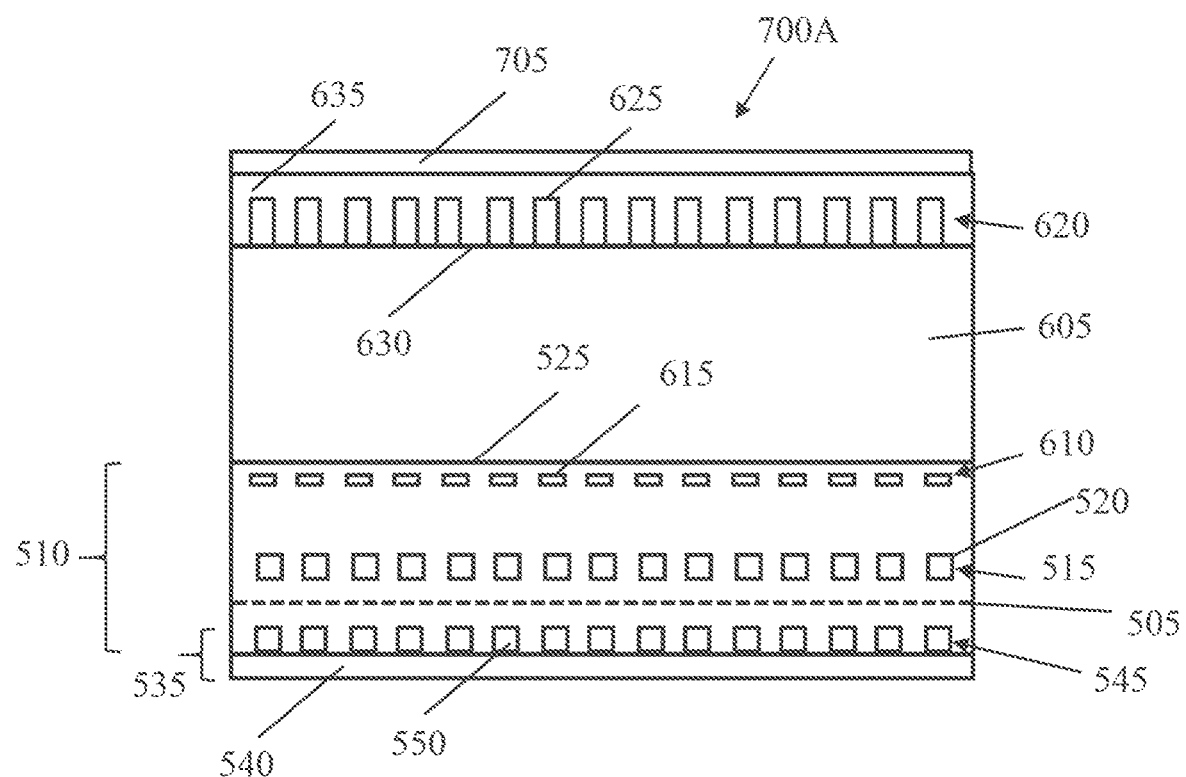
FIG. 7A shows a schematic cross-sectional view of another example LED in which the light emitting active region of the semiconductor diode structure is located within an optical cavity defined by a nanostructured layer embedded within the semiconductor diode structure on one side of the active region and a reflector disposed on or adjacent to a surface of the semiconductor diode structure on the opposite side of the active region from the embedded nanostructured layer, and in which the reflector is or comprises another nanostructured layer.

Example LED 700A of FIG. 7A is similar to example LED 600A, except for optionally comprising a specular reflector 705 disposed adjacent to nanostructured layer 620, opposite from substrate 605. In addition, in this variation some or all of nanoantennas 625 in nanostructured layer 620 are asymmetric. An asymmetric nanoantenna may be a single asymmetrically shaped light scatterer, or may comprise two or more light scatterers arranged in a spatially asymmetric manner. In this variation nanostructured layer 620, optionally in combination with a specular reflector 705, is designed to scatter light that is incident on it at normal or near normal incidence back into substrate 605 and toward a sidewall of substrate 605. This results in light exiting substrate 605 primarily through the side walls, rather than through surface 630, which is advantageous in some applications.

Nanostructured layer configurations that may be suitable for use as a nanostructured layer 620 that scatters light incident on it at normal or near normal incidence back into substrate 605 toward side walls of the substrate are disclosed in U.S. Provisional Patent Application 62/839,123 filed Apr. 26, 2019.

Figure 7B:
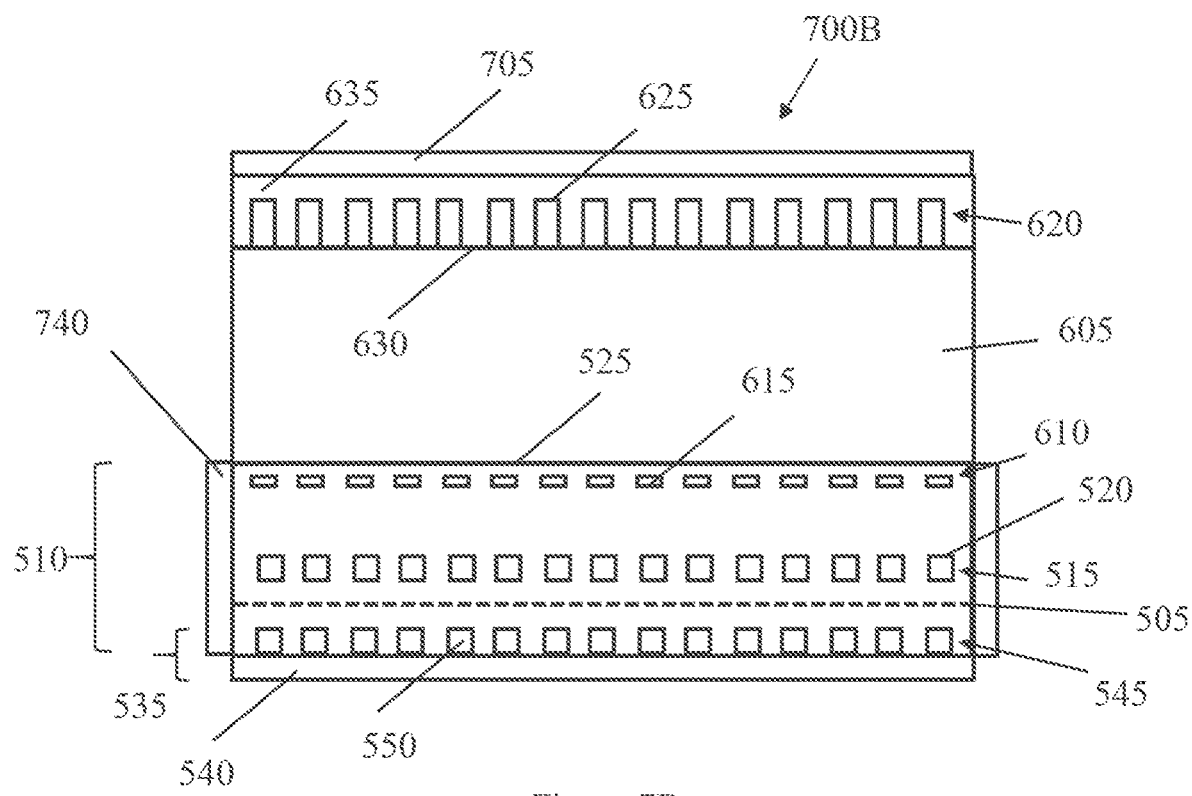
FIG. 7B shows a schematic cross-sectional view of a variation of the LED of FIG. 7A comprising side reflectors.

Example LED 700B shown in FIG. 7B is similar to Example LED 700A, except that it includes side reflectors 740 disposed on sidewalls of semiconductor diode structure 510. Side reflectors 740 may be distributed Bragg reflectors, for example.

As explained above, the optical cavity structure defined by nanostructured layer 515 and reflector 530 (FIG. 5A) or reflector 535 can be arranged so that the active region preferentially emits light in a forward direction toward the embedded nanostructured layer, and thus toward surface 630 of substrate 605 at normal or near normal incidence. This can improve the performance of a nanostructured layer 620 designed to scatter such light out through the side walls of substrate 605, or to collimate the light, or to angularly filter the light.

This disclosure is illustrative and not limiting. Further modifications will be apparent to one skilled in the art in light of this disclosure and are intended to fall within the scope of the appended claims.

What is claimed is:

1. A light emitting device comprising:
   a semiconductor diode structure comprising an active region, a top surface, an oppositely positioned bottom surface, and side surfaces connecting the top and bottom surfaces;
   an array of nanoantennas embedded in the semiconductor diode structure between the active region and the top surface; and
   a reflector located on the opposite side of the active region from the nanostructured layer,
   the array of nanoantennas and the reflector forming an optical cavity that defines a plurality of cavity modes and a density of states, structures and positions of the nanoantennas and the reflector resulting in the cavity modes and density of states being tuned to achieve a selected level of internal quantum efficiency.

2. The light emitting device of claim 1, wherein the reflector is located a distance from the active region less than or equal to a peak wavelength of light emitted by the active region in operation of the light emitting device.

3. The light emitting device of claim 1, wherein the nanostructured layer is located a distance from the active region less than or equal to a peak wavelength of light emitted by the active region in operation of the light emitting device.

4. The light emitting device of claim 1, wherein the nanostructured layer is located a distance from the active region greater than a peak wavelength of light emitted by the active region in operation of the light emitting device.

5. The light emitting device of claim 4, wherein the nanostructured layer is located adjacent the top surface of the semiconductor diode structure.

6. The light emitting device of claim 1, wherein the reflector is or comprises a specular reflector.

7. The light emitting device of claim 1, wherein the reflector comprises a nanostructured reflector layer comprising an array of nanoantennas.

8. The light emitting device of claim 7, wherein the nanoantennas are embedded in the bottom surface of the semiconductor diode structure.

9. The light emitting device of claim 7, wherein the nanoantennas are disposed on the bottom surface of the semiconductor diode structure.

10. The light emitting device of claim 7, wherein the nanoantennas are spaced apart from the bottom surface of the semiconductor diode structure.

11. The light emitting device of claim 1, wherein the reflector comprises a specular reflector and a nanostructured reflector layer comprising an array of nanoantennas disposed between the specular reflector and the active region.

12. The light emitting device of claim 11, wherein the nanoantennas are embedded in the bottom surface of the semiconductor diode structure.

13. The light emitting device of claim 12, wherein the specular reflector is spaced apart from the nanoantennas.

14. The light emitting device of claim 12, wherein the specular reflector is adjacent the nanoantennas.

15. The light emitting device of claim 11, wherein the nanoantennas are disposed on the bottom surface of the semiconductor diode structure.

16. The light emitting device of claim 15, wherein the specular reflector is spaced apart from the nanoantennas.

17. The light emitting device of claim 15, wherein the specular reflector is adjacent the nanoantennas.

18. The light emitting device of claim 11, wherein the nanoantennas are spaced apart from the bottom surface of the semiconductor diode structure.

19. The light emitting device of claim 18, wherein the specular reflector is spaced apart from the nanoantennas.

20. The light emitting device of claim 18, wherein the specular reflector is adjacent the nanoantennas.

21. The light emitting device of claim 1, comprising:
a transparent substrate comprising a top surface, an oppositely positioned bottom surface, and side surfaces connecting the top and bottom surfaces, the bottom surface of the transparent substrate disposed on or adjacent the top surface of the semiconductor diode structure; and
a nanostructured layer comprising an array of nanoantennas disposed on or adjacent the top surface of the transparent substrate.

22. The light emitting device of claim 21, wherein the array of nanoantennas disposed on or adjacent the top surface of the transparent substrate is configured to collimate light emitted by the active region and incident on the top surface of the transparent substrate during operation of the light emitting device.

23. The light emitting device of claim 21, wherein the array of nanoantennas disposed on or adjacent the top surface of the transparent substrate is configured to angularly filter light emitted by the active region and incident on the top surface of the transparent substrate during operation of the light emitting device.

24. The light emitting device of claim 21, wherein the array of nanoantennas disposed on or adjacent the top surface of the transparent substrate is configured to reflect toward a side surface of the transparent substrate light that is incident on the top surface of the transparent substrate at or near normal incidence during operation of the light emitting device.

25. The light emitting device of claim 1, comprising:
a transparent substrate comprising a top surface and an oppositely positioned bottom surface disposed with its bottom surface on or adjacent the top surface of the semiconductor diode structure; and
a nanostructured layer comprising an array of nanoantennas disposed at or adjacent an interface between the top surface of the semiconductor diode structure and the bottom surface of the transparent substrate.

26. The light emitting device of claim 25, wherein the array of nanoantennas disposed at or adjacent the interface between the top surface of the semiconductor diode structure and the bottom surface of the transparent substrate is configured to reduce reflection of light emitted by the active region and incident on the interface during operation of the light emitting device.

27. The light emitting device of claim 25, wherein the array of nanoantennas disposed at or adjacent the interface between the top surface of the semiconductor diode structure and the bottom surface of the transparent substrate is configured to collimate light emitted by the active region and incident on the interface during operation of the light emitting device.

28. A light emitting device, comprising:
a substrate; and
an array of LEDs arranged on the substrate, each LED comprising
a semiconductor diode structure comprising an active region, a top surface, an oppositely positioned bottom surface, and side surfaces connecting the top and bottom surfaces, the bottom surface disposed on or adjacent the substrate;
a nanostructured layer comprising an array of nanoantennas embedded in the semiconductor diode structure between the active region and the top surface; and
a reflector located on the opposite side of the active region from the nanostructured layer,
the array of nanoantennas and the reflector forming an optical cavity that defines a plurality of cavity modes and a density of states, structures and positions of the nanoantennas and the reflector resulting in the cavity modes and density of states being tuned to achieve a selected level of internal quantum efficiency.

29. The light emitting device of claim 28, wherein the array of LEDs is a monolithic array of LEDs.

30. The light emitting device of claim 29, wherein the LEDs are microLEDs.

31. The light emitting device of claim 30, wherein a spacing between adjacent microLEDs is less than or equal to ten microns.

* * * * *